(12) United States Patent
Kim et al.

(10) Patent No.: US 8,525,341 B2
(45) Date of Patent: Sep. 3, 2013

(54) PRINTED CIRCUIT BOARD HAVING DIFFERENT SUB-CORE LAYERS AND SEMICONDUTOR PACKAGE COMPRISING THE SAME

(75) Inventors: Hyun-Ki Kim, Cheonan-si (KR); Dae-Young Choi, Yeosu-si (KR); Mi-Yeon Kim, Yongin-si (KR)

(73) Assignee: Samsung Electronics Co., Ltd., Samsung-ro, Yeongtong-gu, Suwon-si, Gyeonggi-do (KR)

( * ) Notice: Subject to any disclaimer, the term of this patent is extended or adjusted under 35 U.S.C. 154(b) by 0 days.

(21) Appl. No.: 13/240,083

(22) Filed: Sep. 22, 2011

(65) Prior Publication Data

US 2012/0168951 A1 Jul. 5, 2012

(30) Foreign Application Priority Data

Dec. 30, 2010 (KR) .................. 10-2010-0139485

(51) Int. Cl.
*H01L 23/48* (2006.01)
*H05K 1/09* (2006.01)
*H05K 1/02* (2006.01)
*H05K 1/00* (2006.01)

(52) U.S. Cl.
USPC ...... 257/762; 257/E23.01; 257/782; 257/668; 257/700; 257/701; 257/758; 174/250; 174/257; 174/258

(58) Field of Classification Search
USPC .............. 257/668, 782, 762, E23.01, 700, 257/701, 758; 174/250, 257, 258
See application file for complete search history.

(56) References Cited

U.S. PATENT DOCUMENTS

| | | | |
|---|---|---|---|
| 2009/0288293 A1 | 11/2009 | Lee et al. | |
| 2010/0032826 A1* | 2/2010 | Tachibana et al. | 257/692 |
| 2010/0212947 A1* | 8/2010 | Yamanaka et al. | 174/260 |
| 2010/0224395 A1* | 9/2010 | Higashitani | 174/258 |
| 2010/0232127 A1* | 9/2010 | Mori et al. | 361/783 |
| 2011/0024172 A1* | 2/2011 | Maruyama et al. | 174/258 |
| 2011/0100700 A1* | 5/2011 | Kariya et al. | 174/267 |
| 2011/0220403 A1* | 9/2011 | Lin | 174/261 |
| 2012/0012247 A1* | 1/2012 | Sohn et al. | 156/252 |
| 2012/0112781 A1* | 5/2012 | Kuitani et al. | 324/756.03 |
| 2012/0132462 A1* | 5/2012 | Harazono et al. | 174/260 |
| 2012/0168214 A1* | 7/2012 | Kashiwagi et al. | 174/257 |
| 2012/0241202 A1* | 9/2012 | Vasoya | 174/257 |
| 2012/0247813 A1* | 10/2012 | Ueda et al. | 174/251 |

\* cited by examiner

*Primary Examiner* — A O Williams
(74) *Attorney, Agent, or Firm* — Muir Patent Consulting, PLLC

(57) ABSTRACT

Provided are a printed circuit board (PCB) and a semiconductor package including the same. The PCB includes a core layer having a stacked structure including at least a first layer made of a first material that has a first coefficient of thermal expansion (CTE) and a second layer made of a second material that has a second CTE different from the first CTE, an upper wiring layer disposed on a first surface of the core layer, and a lower wiring layer disposed on a second surface of the core layer opposite the first surface.

19 Claims, 10 Drawing Sheets

PRINTED CIRCUIT BOARD HAVING DIFFERENT SUB-CORE LAYERS AND SEMICONDUTOR PACKAGE COMPRISING THE SAME

CROSS-REFERENCE TO RELATED APPLICATION

This application claims priority to Korean Patent Application No. 10-2010-0139485 filed on Dec. 30, 2010 in the Korean Intellectual Property Office, and all the benefits accruing therefrom under 35 U.S.C. 119, the contents of which application in its entirety are herein incorporated by reference.

BACKGROUND

1. Field

The present disclosure relates to a printed circuit board and a semiconductor package comprising the same.

2. Description of the Related Art

In general, a printed circuit board (PCB) for a semiconductor package, including one or more semiconductor chips mounted thereon, is fixed on a mother board of an electronic device and functions to mediate transmission of electrical signals between the semiconductor chips and the mother board.

The semiconductor package is vulnerable to a physical stress, such as warpage, when the PCB is subjected to various processes for manufacturing the semiconductor package. In the course of performing various processes for manufacturing the semiconductor package, the warpage may occur to the semiconductor package. The warpage can be caused, for example, due to a coefficient of thermal expansion (CTE) mismatch between a semiconductor chip, molding resin and a PCB. As the result, the PCB may warp, leading to warpage of the semiconductor package itself.

The warpage of the semiconductor package may undesirably cause bonding failures when the semiconductor package is stacked or when the semiconductor package is mounted on a mother board.

SUMMARY

The present disclosure provides a printed circuit board (PCB) of a semiconductor package, which can prevent the semiconductor package from warping.

The present disclosure also provides a semiconductor package including the PCB.

These and other objects disclosed herein will be described in or be apparent from the following description of certain embodiments.

According to an aspect of the disclosed embodiments, there is provided a PCB including a core layer having a stacked structure including at least a first layer made of a first material that has a first coefficient of thermal expansion (CTE) and a second layer made of a second material that has a second CTE different from the first CTE, an upper wiring layer disposed on a first surface of the core layer, and a lower wiring layer disposed on a second surface of the core layer opposite the first surface.

According to another aspect of the disclosed embodiments, there is provided a semiconductor package including a printed circuit board (PCB), a semiconductor chip mounted on the PCB, and a molding portion covering the semiconductor chip. The PCB includes a core layer having a stacked structure including at least a first layer made of a first material having a first coefficient of thermal expansion (CTE) and a second layer made of a second material having a second CTE greater than the first CTE, an upper wiring layer disposed between the core layer and the semiconductor chip, and a lower wiring layer disposed on an opposite side of the core layer as the upper wiring layer.

According to yet another aspect of the disclosed embodiments, there is provided a semiconductor package including a printed circuit board (PCB), a semiconductor chip mounted on the PCB, and a molding portion covering the semiconductor chip. The PCB comprises a core layer having a stacked structure including at least a first layer made of a first material and a second layer made of a second material different from the first material, wherein the second layer is disposed between the first layer and the molding portion; an upper wiring layer disposed between the core layer and the semiconductor chip; and a lower wiring layer disposed on an opposite side of the core layer as the upper wiring layer.

BRIEF DESCRIPTION OF THE DRAWINGS

The above and other features and advantages will become more apparent by describing in detail certain embodiments thereof with reference to the attached drawings in which.

DETAILED DESCRIPTION OF THE EMBODIMENTS

Figure 1:
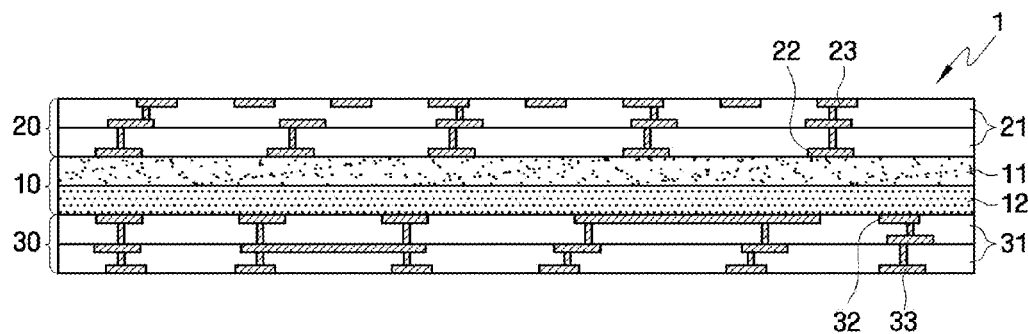
FIG. 1 is a cross-sectional view of a printed circuit board (PCB) according to one exemplary embodiment.

Advantages and features of the present disclosure and methods of accomplishing the same may be understood more readily by reference to the following detailed description of various embodiments and the accompanying drawings. The disclosed embodiments may, however, be embodied in many different forms and should not be construed as being limited to the embodiments set forth herein. In the drawings, the thickness of layers and regions are exaggerated for clarity.

Like numbers refer to like elements throughout. As used herein, the term "and/or" includes any and all combinations of one or more of the associated listed items.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "made of," when used in this specification, specify the presence of stated features, integers, steps, operations, elements, and/or components, but do not preclude the presence or addition of one or more other features, integers, steps, operations, elements, components, and/or groups thereof.

It will be understood that, although the terms first, second, etc. may be used herein to describe various elements, these elements should not be limited by these terms. Unless indicated otherwise, these terms are only used to distinguish one element from another element. Thus, for example, a first element, a first component or a first section discussed below could be termed a second element, a second component or a second section without departing from the teachings of the disclosed embodiments.

Embodiments described herein will be described referring to plan views and/or cross-sectional views by way of ideal schematic views. Accordingly, the exemplary views may be modified depending on manufacturing technologies and/or tolerances. Therefore, the embodiments of the invention are not limited to those shown in the views, but include modifications in configuration formed, for example, on the basis of manufacturing processes. Therefore, regions and elements exemplified in the figures may have schematic properties and shapes shown in the figures, but are not limited as such.

It will be understood that when an element is referred to as being "connected" or "coupled" to, "adjacent," or "on" another element, it can be directly connected or coupled to or adjacent or on the other element or intervening elements may be present. In contrast, when an element is referred to as being "directly connected," "directly coupled" to, "directly adjacent" to, or "directly on" another element, there are no intervening elements present.

Spatially relative terms, such as "beneath," "below," "lower," "above," "upper" and the like, may be used herein for ease of description to describe one element's or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (rotated 90 degrees or at other orientations) and the spatially relative descriptors used herein interpreted accordingly.

Terms such as "same," "planar," or "coplanar," as used herein when referring to orientation, layout, location, shapes, sizes, amounts, or other measures do not necessarily mean an exactly identical orientation, layout, location, shape, size, amount, or other measure, but are intended to encompass nearly identical orientation, layout, location, shapes, sizes, amounts, or other measures within acceptable variations that may occur, for example, due to manufacturing processes.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Hereinafter, a printed circuit board (PCB) according to one exemplary embodiment will be described with reference to FIG. 1. FIG. 1 is a cross-sectional view of a printed circuit board (PCB) according to one embodiment.

Referring to FIG. 1, the PCB 1 includes a core layer 10, an upper wiring layer 20 and a lower wiring layer 30.

The core layer 10 has a stacked structure including multiple layers made of different materials. In detail, for example, the core layer 10 may have a stacked structure including multiple layers made of materials having different coefficient of thermal expansions (CTEs). For example, in one embodiment, the core layer 10 includes a first sub-core layer 11 and a second sub-core layer 12 stacked one on the other. These two layers may be the only layers in the core, resulting in some embodiments in a PCB that overall has an even number of layers. In one embodiment, the first sub-core layer 11 and second sub-core layer 12 are disposed immediately adjacent to each other, such that a surface of one layer contacts a surface of the other layer. Here, CTEs of the first sub-core layer 11 and the second sub-core layer 12 are different from each other. For example, in one embodiment, a difference between the CTEs of the first sub-core layer 11 and the second sub-core layer 12 may be greater than or equal to 1 ppm/° C. When the CTE difference between the first sub-core layer 11 and the second sub-core layer 12 is greater than or equal to 1 ppm/° C., warping of the PCB 1 can be more effectively prevented.

In certain embodiments, the first sub-core layer 11 and the second sub-core layer 12 may have the same thickness. Alternatively, the first sub-core layer 11 and the second sub-core layer 12 may have different thicknesses. For example, a thickness difference of the first sub-core layer 11 and the second sub-core layer 12 may be greater than or equal to 1 μm.

The first sub-core layer 11 and the second sub-core layer 12 may be formed of conductive materials or insulating materials. For example, both of the first sub-core layer 11 and the second sub-core layer 12 may be formed of conductive materials or insulating materials. Alternatively, one of the first sub-core layer 11 and the second sub-core layer 12 may be formed of a conductive material and the other may be formed of an insulating material. Examples of the insulating material for the first sub-core layer 11 and the second sub-core layer 12 may include, but are not limited to glass fiber, and examples of the useful conductive material for the first sub-core layer 11 and the second sub-core layer 12 may include, but are not limited to copper (Cu) or an alloy. Examples of the alloy may include, but are not limited to, nickel (Ni), copper (Cu), silver (Ag) or iron (Fe) combined with other elements.

For example, if the CTE of the upper core layer, i.e., the first sub-core layer 11, is smaller than that of the lower core layer, i.e., the second sub-core layer 12, the first sub-core layer 11 may be formed of a first material, such as an alloy having CTE of approximately 10 ppm/° C. and the second sub-core layer 12 may be formed of a second material, such as copper (Cu) having CTE of approximately 17 ppm/° C. Alternatively, the first sub-core layer 11 may be formed of first material, such as a glass fiber having CTE of approximately 8 ppm/° C., and the second sub-core layer 12 may be formed of a second material, such as copper (Cu) having CTE of approximately 17 ppm/° C. or an alloy having CTE of approximately 10 ppm/° C. As such, a combined CTE for the core, including the first sub-core layer 11 and second sub-core layer 12, may be, for example, between 8 ppm/° C. and 17 ppm/° C.

In one embodiment, the core layer 10 includes one or more through vias or conductive lines that connect circuitry in the upper insulating layer 21 to the lower insulating layer 31. An example of such circuitry is described in U.S. Patent Application Publication No. 2009/0288293 to Lee et al., which is incorporated herein by reference in its entirety. The core includes two or more sub-core layers (in one embodiment as shown in FIGS. 1-8, it includes only two sub-core layers), and in one embodiment, the two or more sub-core layers are sandwiched between a symmetric arrangement of insulating and/or other layers symmetrically disposed above and below the core. The top-most and bottom-most of the two or more sub-core layers may be directly adjacent to the insulating and/or other layers symmetrically arranged around the core, as shown in FIGS. 1-8. In one embodiment, the sub-core layers within the core each include a continuous, homogenous material (e.g., copper, alloy, glass fiber) that extends from a first end of the substrate to a second end of the substrate.

In one embodiment, the upper wiring layer 20 is formed on the core layer 10 at a first surface. The upper wiring layer 20 may include, for example, an upper circuit pattern 22 formed in an upper insulation layer 21, and an upper connection pad 23 electrically connected to the upper circuit pattern 22 and formed at a surface of the upper insulation layer 21. The upper insulation layer 21 may include a single layer or multiple layers (the multiple layers may be the same materials or different materials). The upper insulation layer 21 may be made of, for example, prepreg or liquid crystal polymer (LCP), but is not limited thereto.

In one embodiment, the lower wiring layer 30 may be formed on the core layer 10, at a second surface opposite the first surface. Like the upper wiring layer 20, the lower wiring layer 30 may include, for example, a lower circuit pattern 32 formed in a lower insulation layer 31, and a lower connection pad 33 electrically connected to the lower circuit pattern 32 and formed at a surface of the lower insulation layer 31. The lower insulation layer 31 may include a single layer or multiple layers (the multiple layers may be the same materials or different materials), and may be made of, for example, Prepreg or liquid crystal polymer (LCP), but is not limited thereto. The upper wiring layer 20 and the lower wiring layer 30 may be formed of different materials from each other, or may be formed of the same material as each other.

Figure 2:
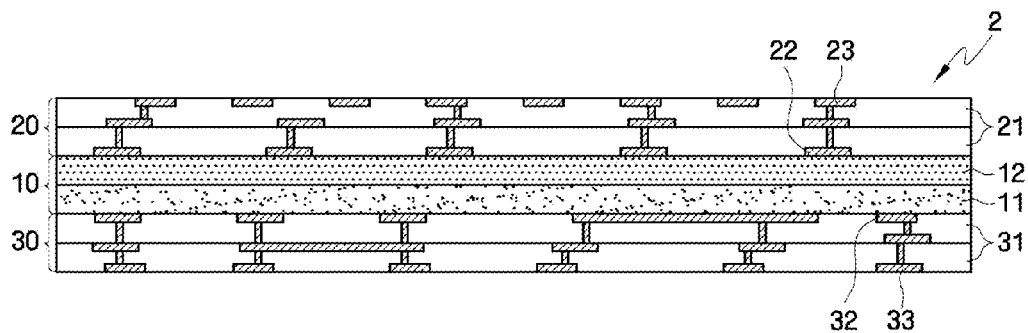
FIG. 2 is a cross-sectional view of a PCB according to another exemplary embodiment.

A PCB according to another exemplary embodiment will now be described with reference to FIG. 2. FIG. 2 is a cross-sectional view of a PCB according to another embodiment. In FIG. 2, substantially the same components as those shown in FIG. 1 are denoted by the same reference numerals, and a detailed description thereof will be omitted.

Referring to FIG. 2, the illustrated PCB 2 is different from the PCB 1 shown in FIG. 1 in that a second sub-core layer 12 is stacked on a first sub-core layer 11, and the CTE of the upper layer, i.e., the second sub-core layer 12, is greater than that of the lower layer, i.e., the first sub-core layer 11. For example, the second sub-core layer 12 may be formed of copper (Cu) having CTE of approximately 17 ppm/° C. and the first sub-core layer 11 may be formed of an alloy having CTE of approximately 10 ppm/° C. Alternatively, the second sub-core layer 12 may be formed of copper (Cu) having CTE of approximately 17 ppm/° C. or an alloy having CTE of approximately 10 ppm/° C. and the first sub-core layer 11 may be formed of glass fiber having CTE of approximately 8 ppm/° C. As such, as shown in FIGS. 1 and 2, a PCB may be formed having, for example, two core layers immediately adjacent each other, where a first core layer closer to an upper wiring layer of the PCB that connects to one or more chips has a higher CTE than a second core layer closer to a lower wiring layer of the PCB that connects to a board. Alternatively, the first core layer can have a lower CTE than the second core layer. The lower CTE may have a difference from the higher CTE of as little as 1 ppm/° C., as discussed previously, or may vary, for example, within a range of ratios compared to the higher CTE (e.g., between 80% to 50% of the higher CTE).

Figure 3:
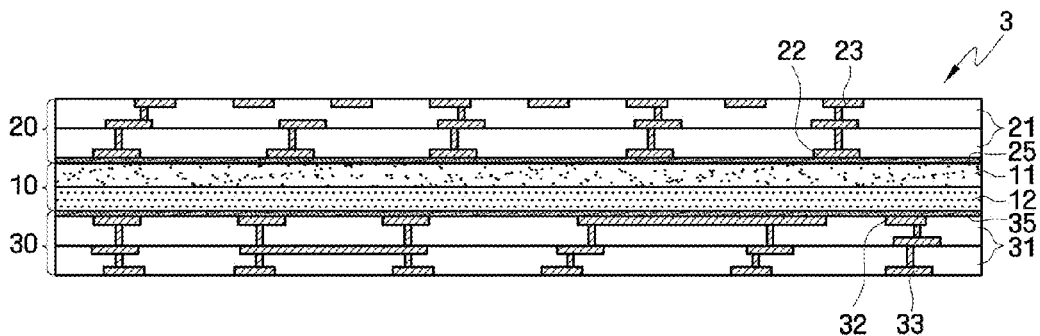
FIG. 3 is a cross-sectional view of a PCB according to another exemplary embodiment.

A PCB according to another exemplary embodiment will now be described with reference to FIG. 3. FIG. 3 is a cross-sectional view of a PCB according to another embodiment. In FIG. 3, substantially the same components as those shown in FIG. 1 are denoted by the same reference numerals, and a detailed description thereof will be omitted.

Referring to FIG. 3, a PCB 3 of this embodiment is different from the PCB 1 shown in FIG. 1 in that a first insulation layer 25 is formed between the first sub-core layer 11 and the upper wiring layer 20, and a second insulation layer 35 is formed between the second sub-core layer 12 and the lower wiring layer 30. In this case, the first sub-core layer 11 and the second sub-core layer 12 may be formed of the same conductive material or different conductive materials. Since the core layer 10 is formed of a conductive material, the first insulation layer 25 and the second insulation layer 35 may be formed in order to prevent electrical connection between the upper wiring layer 20 and the lower wiring layer 30. The first insulation layer 25 and the second insulation layer 35 may be adhesive layers formed of an adhesive material such as polyimide.

Figure 4A:
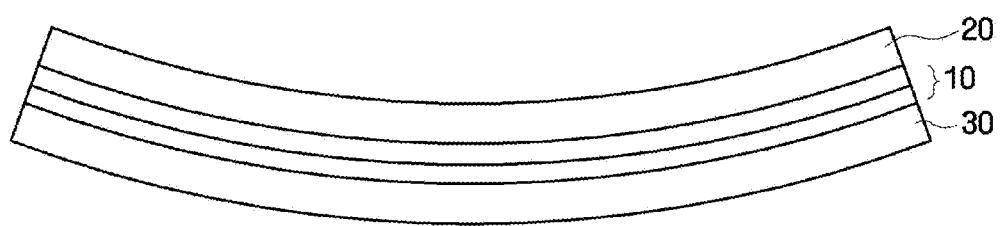
FIGS. 4A and 4B illustrate exemplary deformation of the PCBs shown in FIGS. 1 and 2 according to the external temperature.
Figure 4B:

The phenomena in which the PCBs shown in FIGS. 1 to 3 are deformed according to the external temperature will now be described with reference to FIGS. 4A and 4B. FIGS. 4A and 4B illustrate deformation of the PCBs shown in FIGS. 1 to 3 according to the external temperature.

When the PCB 1 is in a flat state, as shown in FIG. 1, the external temperature is measured and the measured temperature is referred to as a first temperature (also referred to as a reference temperature, or flat state reference temperature). For example, the first temperature may be a room temperature, or other temperature that causes the PCB to remain flat. In a first example, it is assumed that a temperature the PCB 1 is a second temperature higher than the first temperature. At that temperature, since the CTE of the lower, second sub-core layer 12 is greater than that of the first sub-core layer 11, the lower, second sub-core layer 12 will expand more than the first sub-core layer 11. As a result, as shown in FIG. 4A, the PCB 1 is convexly bent downwardly. That is, the PCB 1 bends in a first direction such that the edges of the PCB 1 are higher than a middle portion of PCB 1. The amount of bending may have a particular radius of curvature that depends on the temperature and the materials used. In a second example, assuming the PCB 1 is in a state of a third temperature lower than the first temperature, the second sub-core layer 12 shrinks more than the first sub-core layer 11. As the result, as shown in FIG. 4B, the PCB 1 may be convexly bent upwardly. That is, the PCB 1 bends in a second direction such that the edges of the PCB 1 are lower than a middle portion of PCB 1. The amount of bending may have a particular radius of curvature that depends on the temperature and the materials used.

Regarding PCB 2, when the PCB 2 is in a flat state, as shown in FIG. 2, the external temperature is measured and the measured temperature is referred to as a first temperature (also referred to as a reference temperature, or flat state reference temperature). For example, the first temperature may be a room temperature, or other temperature that causes the PCB to remain flat. In a first example, it is assumed that a temperature the PCB 2 is a second temperature higher than the first temperature. Since the CTE of the upper, second sub-core layer 12 is greater than that of the first sub-core layer 11, the upper, second sub-core layer 12 will expand more than the first sub-core layer 11. As the result, as shown in FIG. 4B, the PCB 2 is convexly bent upwardly. In a second example, assuming the PCB 2 is in a state of a third temperature lower than the first temperature, the second sub-core layer 12 shrinks more than the first sub-core layer 11. As the result, as shown in FIG. 4A, the PCB 2 may be convexly bent downwardly.

Figure 5:
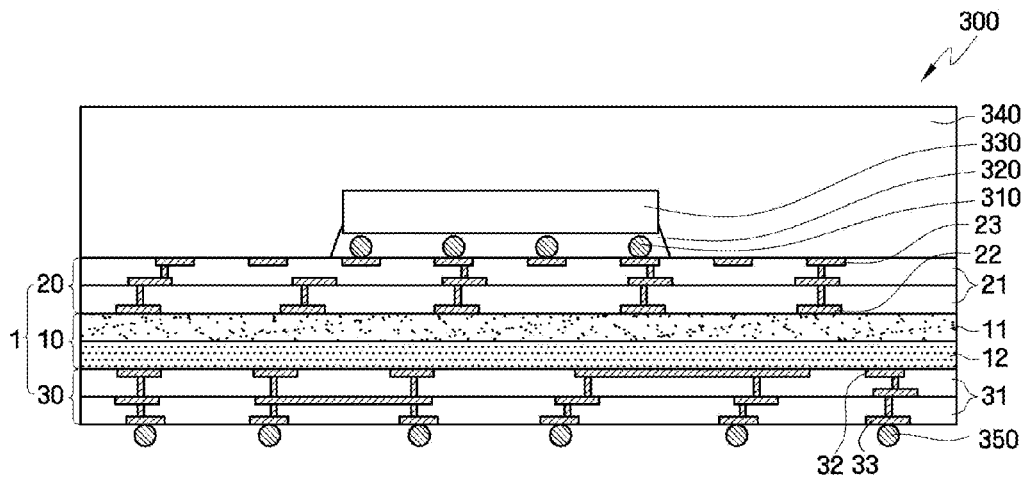
FIG. 5 is a cross-sectional view of a semiconductor package according to one exemplary embodiment.

A semiconductor package according to one embodiment will now be described with reference to FIG. 5. FIG. 5 is a cross-sectional view of a semiconductor package according to one embodiment. In FIG. 5, substantially the same components as those shown in FIGS. 1 to 3 are denoted by the same reference numerals, and a detailed description thereof will be omitted.

Referring to FIG. 5, the semiconductor package 300 includes a semiconductor chip 330 mounted on a PCB 1. The semiconductor chip 330 may include, for example, an integrated circuit (not shown) disposed on its one surface. The integrated circuit may include, for example, a memory circuit and/or a logic circuit. For example, the integrated circuit may include at least one of a random access memory (RAM), a nonvolatile memory, a memory control circuit, an application processor circuit, a power supplier circuit, and a modem or radio frequency (RF) circuit. In addition, though only one semiconductor chip 330 is shown, a stack of chips may be mounted on the PCB 1. One or more of the chips may include a memory circuit, and one or more of the chips may include a logic circuit.

The semiconductor chip 330 may be mounted on the PCB 1 through first connection terminals 310. The first connection terminals 310 may include, for example, at least one selected from the group consisting of a conductive bump, a conductive spacer, a solder ball, a pin grid array (PGA), and combinations thereof. Other types of connections may be used.

An underfill member 320 may be formed between the semiconductor chip 330 and the PCB 1. The underfill member 320 may protect the first connection terminals 310 or the semiconductor chip 330 from external moisture and fix the semiconductor chip 330 on the PCB 1. The underfill member 320 may be formed, for example, of epoxy resin.

The semiconductor package 300 may further include a molding portion 340 covering the semiconductor chip 330. The molding portion 340 may protect the semiconductor chip 330 from external moisture or shock. The molding portion 340 may be formed of, for example, an epoxy molding compound (EMC).

The semiconductor package 300 may further include second connection terminals 350 formed on one surface of the PCB 1 where the semiconductor chip 330 is not mounted. The semiconductor package 300 may be configured such that the second connection means 350 can be mounted on a system board. The second connection means 350 may include at least one selected from the group consisting of a conductive bump, a conductive spacer, a solder ball, a pin grid array (PGA), and combinations thereof.

Figure 6:
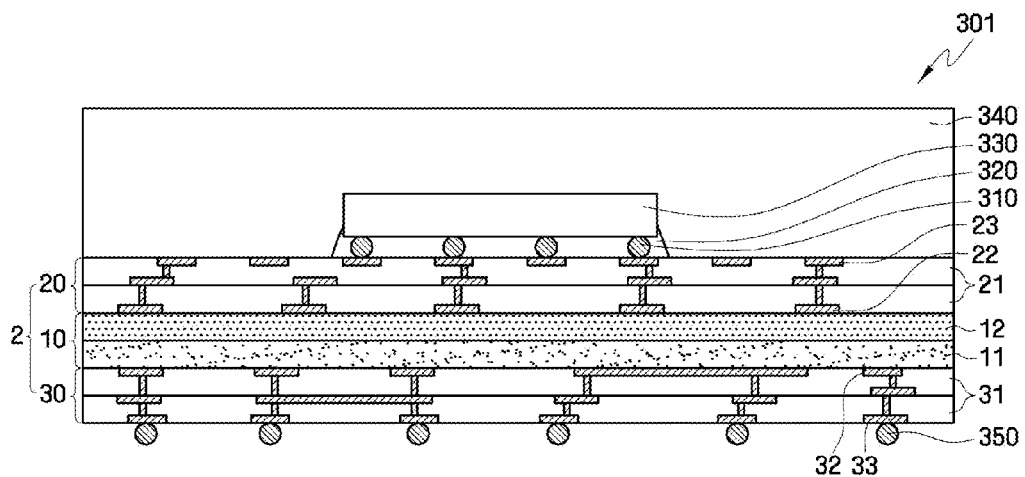
FIG. 6 is a cross-sectional view of a semiconductor package according to another exemplary embodiment.

A semiconductor package according to another embodiment will now be described with reference to FIG. 6. FIG. 6 is a cross-sectional view of a semiconductor package according to another embodiment. In FIG. 6, substantially the same components as those shown in FIGS. 1 to 4 are denoted by the same reference numerals, and a detailed description thereof will be omitted.

Referring to FIG. 6, the illustrated semiconductor package 301 is different from the semiconductor package 300 shown in FIG. 5 in that it employs the PCB 2 shown in FIG. 2, rather than the PCB 1 shown in FIG. 1.

Figure 7:
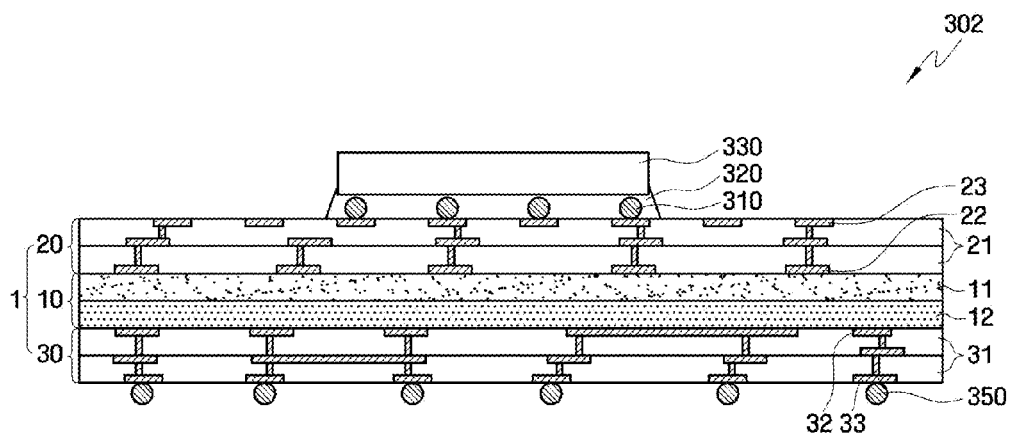
FIG. 7 is a cross-sectional view of a semiconductor package according to still another exemplary embodiment.

A semiconductor package according to still another embodiment will now be described with reference to FIG. 7. FIG. 7 is a cross-sectional view of a semiconductor package according to still another embodiment. In FIG. 7, substantially the same components as those shown in FIGS. 1 to 5 are denoted by the same reference numerals, and a detailed description thereof will be omitted.

Referring to FIG. 7, the illustrated semiconductor package 302 is different from the semiconductor package 300 shown in FIG. 5 in that there is no molding portion (340 of FIG. 5) in the embodiment of FIG. 7.

Figure 8:
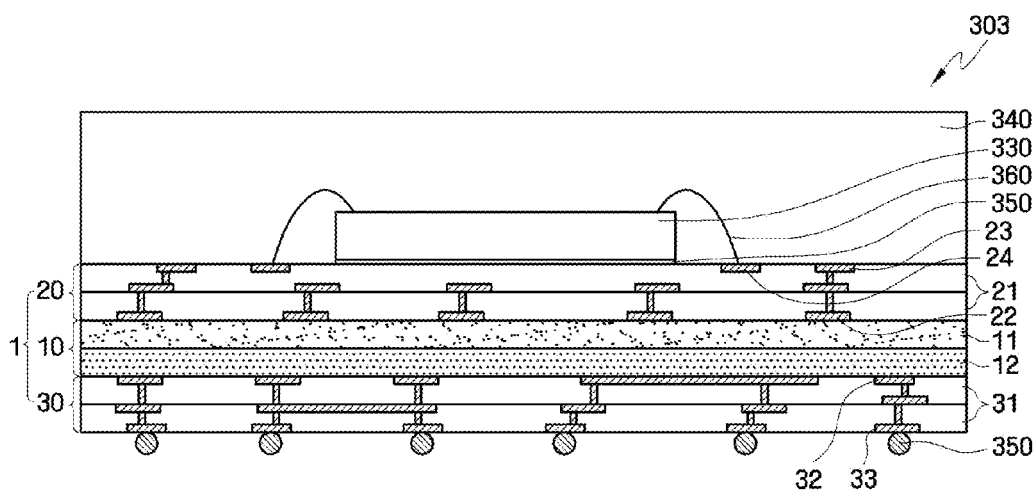
FIG. 8 is a cross-sectional view of a semiconductor package according to still another exemplary embodiment.

A semiconductor package according to still another embodiment will now be described with reference to FIG. 8. FIG. 8 is a cross-sectional view of a semiconductor package according to still another embodiment. In FIG. 8, substantially the same components as those shown in FIGS. 1 to 6 are denoted by the same reference numerals, and a detailed description thereof will be omitted.

Referring to FIG. 8, in the semiconductor package 303, a semiconductor chip 330 is mounted on one surface of a PCB 1 using an adhesive 350, and is electrically connected to an upper connection pad 24 of the PCB 1 through a wire 360. While FIGS. 6 and 7 illustrate that the semiconductor packages 302 and 303 employ the PCB 1 shown in FIG. 1, the PCB 2 shown in FIG. 2 may also be employed.

Figure 9:
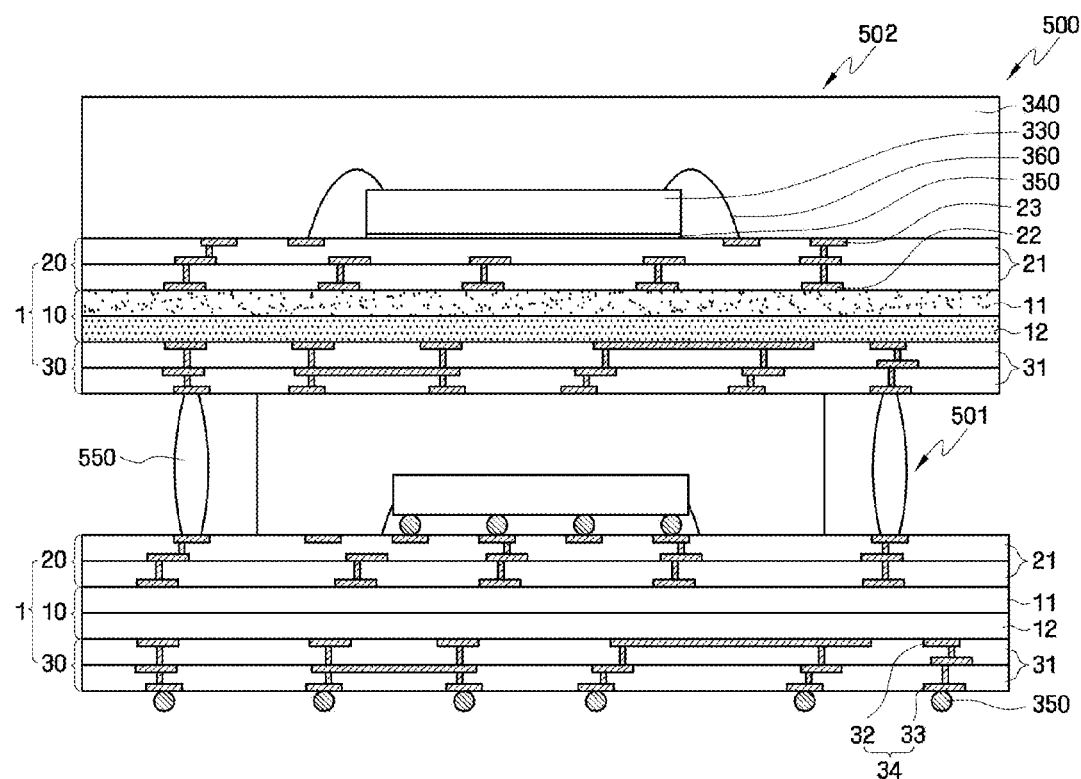
FIG. 9 is a cross-sectional view of a semiconductor package according to still another exemplary embodiment.

A semiconductor package according to still another embodiment will now be described with reference to FIG. 9. FIG. 9 is a cross-sectional view of a semiconductor package according to still another embodiment. In FIG. 9, substantially the same components as those shown in FIGS. 1 to 7 are denoted by the same reference numerals, and a detailed description thereof will be omitted.

Referring to FIG. 9, the semiconductor package 500 is of a package on package (POP) type. The semiconductor package 500 includes a lower package 501 and an upper package 502 stacked on the lower package 501. The lower package 501 and the upper package 502 may include the PCBs 1 and 2 shown in FIGS. 1 and 2, respectively. Alternatively, the lower package 501 and the upper package 502 may be one of the semiconductor packages 300, 301, 302, and 303 shown in FIGS. 4 to 7. For convenience of explanation, FIG. 9 illustrates that the semiconductor package 300 shown in FIG. 5 is used as the lower package 501 and the semiconductor package 303 shown in FIG. 8 is used as the upper package 502.

The semiconductor package 500 may further include a joint member 550 for joining the lower package 501 and the upper package 502. The joint member 550 electrically connects the lower package 501 and the upper package 502 by contacting terminals (e.g., pads) on the lower wiring pattern 30 of the upper package 502 and terminals (e.g., pads) on the upper wiring pattern 20 of the lower package 501.

While FIG. 9 illustrates that both of the lower package 501 and the upper package 502 include the PCB 1 shown in FIG. 1, one of the lower package 501 and the upper package 502 may include the PCB 1 shown in FIG. 1 and the other may include the PCB 2 shown in FIG. 2, or both may include the PCB 2.

Figure 10A:
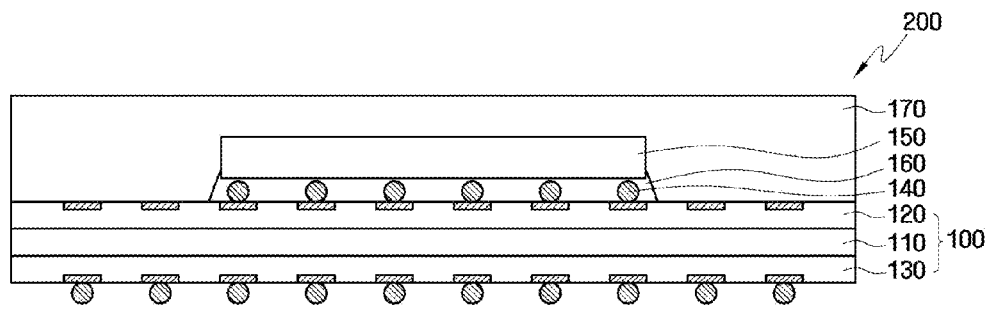
FIG. 10A is a cross-sectional view of a semiconductor package using a PCB including a core layer formed of a single layer.
Figure 10B:
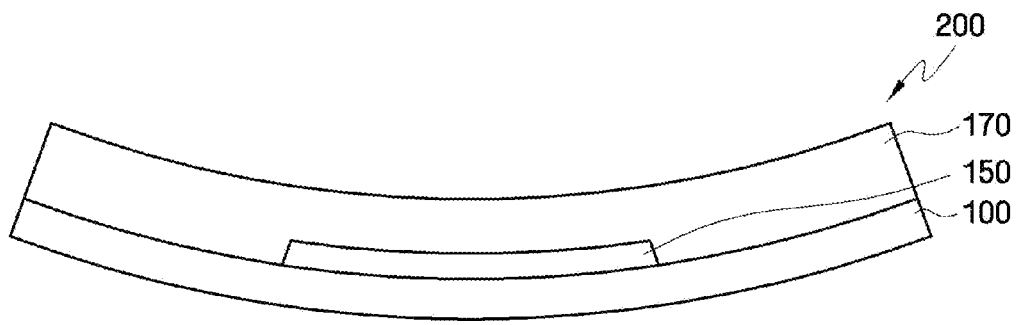
FIGS. 10B and 10C illustrate deformation of the semiconductor package shown in FIG. 10A according to the external temperature.
Figure 10C:
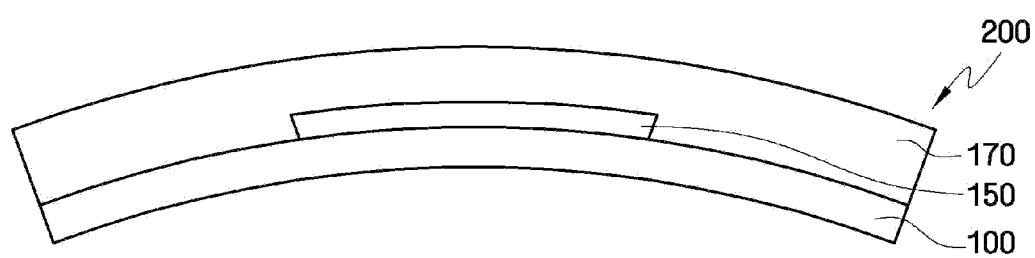

A situation in which the semiconductor package using a PCB including a core layer comprised of a single layer is deformed according to the external temperature will now be described with reference to FIGS. 10A to 10C. FIG. 10A is a cross-sectional view of an exemplary semiconductor package using a PCB including a core layer formed of a single layer, and FIGS. 10B and 10C illustrate deformation of the semiconductor package shown in FIG. 10A according to the external temperature.

Referring to FIG. 10A, the semiconductor package 200 includes a PCB 100, a semiconductor chip 150 mounted on the PCB 100, connection terminals 140, an underfill member 160, and a molding portion 170. The PCB 100 includes a core layer 110, an upper wiring layer 120 and a lower wiring layer 130. Unlike in the embodiments discussed in connection with FIGS. 1-8, the core layer 110 includes a single layer. The upper wiring layer 120 and the lower wiring layer 130 may be formed of the same or similar material having, for example, a same CTE.

When the PCB 100 is in a flat state, as shown in FIG. 10A, the external temperature is measured and the measured temperature is referred to as a first temperature. If a temperature of the PCB 100 changes to a second temperature higher than the first temperature or a third temperature lower than the first temperature, the PCB 100 shrinks or expands in the same extent from top and bottom portions in view of the center of the PCB 100. Thus, warpage occurring to the center of the PCB 100 is applied the center of PCB 100 with the same magnitude in the opposite directions, since the upper wiring layer 120 and lower wiring layer 130 are formed of the same or similar material. Accordingly, the PCB 100 is maintained at a flat state.

Assuming that the external temperature measured when the semiconductor package 200 is in a flat state, as shown in FIG. 10A, is referred to a first temperature, a case in which a temperature of the semiconductor package 200 is a second temperature higher than the first temperature will first be described. If CTEs of the semiconductor chip 150 and the molding portion 170 are smaller than a CTE of the PCB 100, the PCB 100 will expand more than the semiconductor chip 150 and the molding portion 170. Thus, as shown in FIG. 10B, the semiconductor package 200 may be convexly bent downwardly. If CTEs of the semiconductor chip 150 and the molding portion 170 are greater than CTE of the PCB 100, the semiconductor chip 150 and the molding portion 170 will expand more than the PCB 100. Thus, as shown in FIG. 10C, the semiconductor package 200 may be convexly bent upwardly.

On the other hand, assuming that the external temperature measured when the semiconductor package 200 is in a flat state, as shown in FIG. 10A, is referred to a first temperature, a case in which a temperature of the semiconductor package 200 is a third temperature lower than the first temperature will now be described. If CTEs of the semiconductor chip 150 and the molding portion 170 are smaller than the CTE of the PCB 100, the PCB 100 will shrink more than the semiconductor chip 150 and the molding portion 170. Thus, as shown in FIG. 10C, the semiconductor package 200 may be convexly bent upwardly. If CTEs of the semiconductor chip 150 and the molding portion 170 are greater than CTE of the PCB 100, the semiconductor chip 150 and the molding portion 170 will shrink more than the PCB 100. Thus, as shown in FIG. 10B, the semiconductor package 200 may be convexly bent downwardly.

Therefore, warpage occurs according to a change in the external temperature in the semiconductor package 200 using the PCB 100 including the core layer 110 comprised of a single layer.

Next, a situation in which the semiconductor package using the PCB according to the embodiments disclosed in FIGS. 1-8, including a core layer comprised of multiple layers having different CTEs, is affected by the external temperature will be described with reference to FIGS. 4A, 4B, and 5.

Assuming that the external temperature measured when the semiconductor package 300 is in a flat state, as shown in FIG. 5, is referred to a first temperature, a case in which a temperature of the semiconductor package 300 is a second temperature higher than the first temperature will first be described. If CTEs of the semiconductor chip 330 and the molding portion 340 are smaller than CTE of the PCB, the PCB will expand more than the semiconductor chip 330 and the molding portion 340. Thus, the semiconductor package 300 will be subjected to a force that makes the semiconductor package 300 convexly bent downwardly. In this case, however, as shown in FIG. 4B, if the semiconductor package 300 employs the PCB 2 subjected to a force that makes the PCB 2 itself convexly bent upwardly, the force applied to the PCB 2 may offset the force applied to the semiconductor package 300. Accordingly, the semiconductor package 300 is maintained at a flat state, as shown in FIG. 5.

As such, in one embodiment, the CTE of a lower core layer is smaller than the CTE of an upper core layer immediately adjacent to the lower core layer and disposed between the lower core layer and the semiconductor chip 330 and molding portion 340, and the CTEs of the semiconductor chip 330 and molding portion 340 are both smaller than the CTEs of the upper core layer and lower core layer. As such, a CTE of the lower core layer has a value between the CTE of the upper core layer and a CTE of the molding portion 340 or the semiconductor chip 330. As a result, a bend caused by the CTE mismatch in between the core layers counters a bend caused between a CTE mismatch between the core and the molding portion and chip, such that the warpages cancel out and result in a straight semiconductor package 300 with no warpage. In one embodiment, materials of the core layers and molding portion can be chosen such that their CTEs cause the warpages at temperatures typically used during the package formation process to be neutralized. For example, the opposite bends may have equal but opposite radii of curvature, or may exert equal but opposite bending forces on each other.

If the CTEs of the semiconductor chip 330 and the molding portion 340 are greater than the CTE of the PCB, the semiconductor chip 330 and the molding portion 340 will expand more than the PCB. Thus, the semiconductor package 300 will be subjected to a force that makes the semiconductor package 300 convexly bent upwardly. In this case, however, as shown in FIG. 4A, if the semiconductor package 300 employs the PCB 1 subjected to a force that makes the PCB 1 itself convexly bent downwardly at the second temperature higher than the first temperature, the force applied to the PCB 1 may offset the force applied to the semiconductor package 300. Accordingly, the semiconductor package 300 is maintained at a flat state, as shown in FIG. 5.

As such, in one embodiment, the CTE of a lower core layer is larger than the CTE of an upper core layer immediately adjacent to the lower core layer and disposed between the lower core layer and the semiconductor chip 330 and molding portion 340, and the CTEs of the semiconductor chip 330 and molding portion 340 are both larger than the CTEs of the upper core layer and lower core layer. As such, a CTE of the lower core layer has a value between the CTE of the upper core layer and a CTE of the molding portion 340 or the semiconductor chip 330. As a result, a bend caused by the CTE mismatch in between the core layers counters a bend caused between a CTE mismatch between the core and the molding portion and chip, such that the warpages cancel out and result in a straight semiconductor package 300 with no warpage. In one embodiment, materials of the core layers and molding portion can be chosen such that their CTEs cause the warpages at temperatures typically used during the package formation process to be neutralized. For example, the opposite bends may have equal but opposite radii of curvature, or may exert equal but opposite bending forces on each other.

As another example, assuming that the external temperature measured when the semiconductor package 300 is in a flat state, as shown in FIG. 5, is referred to a first temperature, a case in which a temperature of the semiconductor package 300 is a third temperature lower than the first temperature will first be described. If the CTEs of the semiconductor chip 330 and the molding portion 340 are smaller than the CTE of the PCB, the PCB will shrink more than the semiconductor chip 330 and the molding portion 340. Thus, the semiconductor package 300 will be subjected to a force that makes the semiconductor package 300 convexly bent upwardly. In this case, however, as shown in FIG. 4A, if the semiconductor package 300 employs the PCB 2 subjected to a force that makes the PCB 2 itself convexly bent downwardly at the third temperature lower than the first temperature, the force applied to the PCB 2 may offset the force applied to the semiconductor package 300. Accordingly, the semiconductor package 300 is maintained at a flat state, as shown in FIG. 5.

Alternatively, if the CTEs of the semiconductor chip 330 and the molding portion 340 are greater than the CTE of the PCB, the semiconductor chip 330 and the molding portion 340 will shrink more than the PCB at a third temperature lower than the first temperature. Thus, the semiconductor package 300 will be subjected to a force that makes the semiconductor package 300 convexly bent downwardly. In this case, however, as shown in FIG. 4B, if the semiconductor package 300 employs the PCB 1 subjected to a force that makes the PCB 1 itself convexly bent upwardly at the second temperature lower than the first temperature, the force applied to the PCB 1 may offset the force applied to the semiconductor package 300. Accordingly, the semiconductor package 300 is maintained at a flat state, as shown in FIG. 5.

Figure 11:
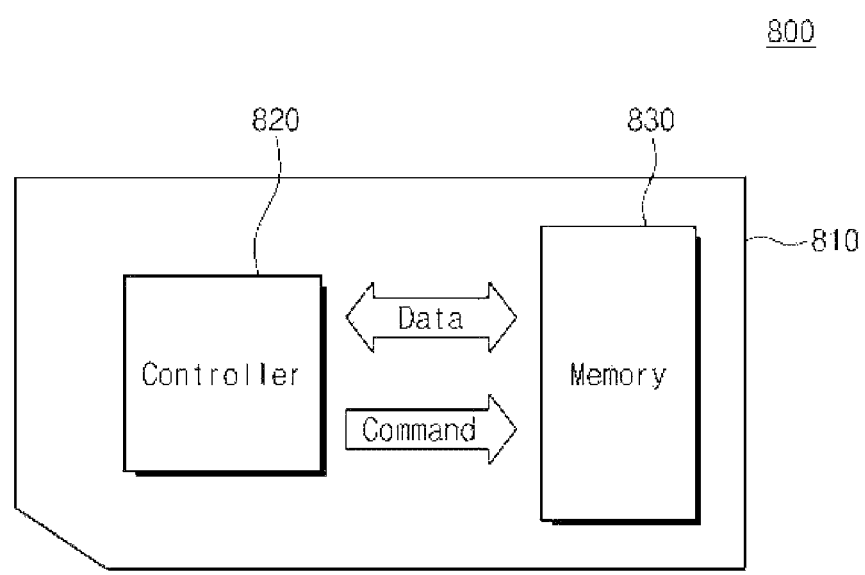
FIG. 11 is a schematic diagram of a memory card to which a semiconductor package according to an exemplary embodiment is applied.

FIG. 11 is a schematic diagram of a memory card to which a semiconductor package according to one embodiment is applied.

Referring to FIG. 11, a memory card 800 may include a controller 820 and a memory 830 in a housing 810. The controller 820 and the memory 830 may exchange electrical signals. For example, the memory 830 and the controller 820 may exchange data under a command of the controller 820. Accordingly, the memory card 800 may store data in the memory 830 or may output data from the memory 830 to the outside.

The controller 820 or the memory 830 may include at least one of the semiconductor packages according to the embodiments described above. For example, the controller 820 may include a system in package (SIP) and the memory 830 may include a multi-chip package. Alternatively, the controller 820 and/or the memory 830 may be provided in the form of a stacked package. The memory card 800 may be used as data storage media of various portable devices. For example, the memory card 800 may include a multi media card (MMC), a secure digital (SD) card, and the like.

Figure 12:
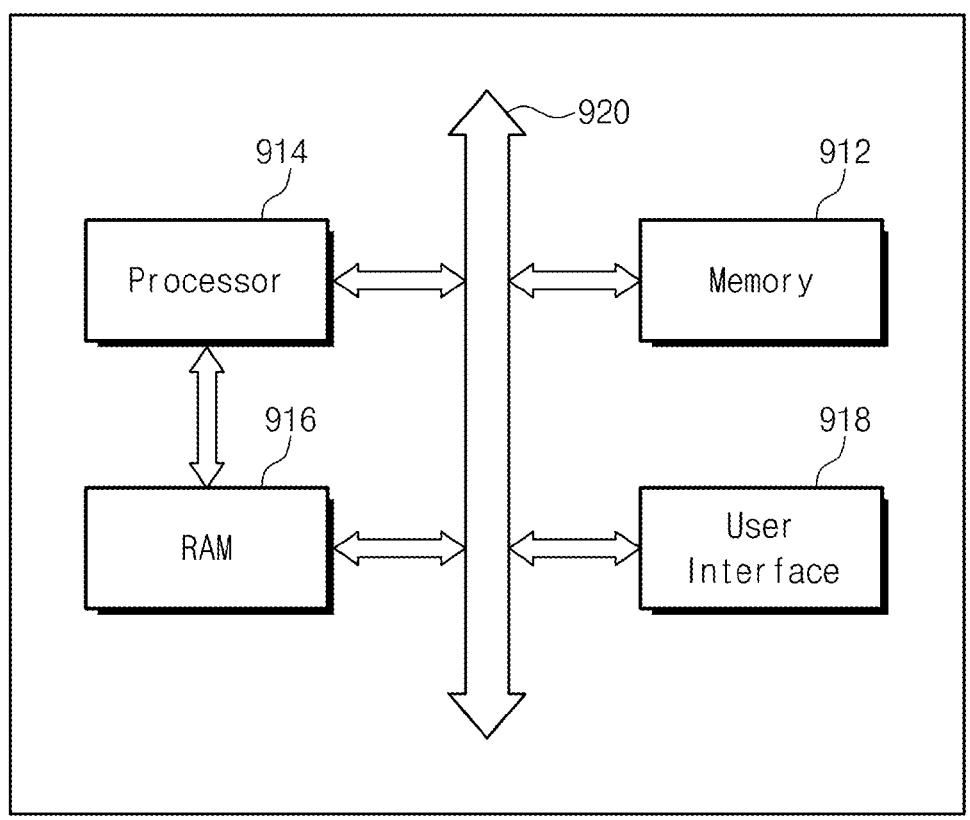
FIG. 12 is a block diagram of an electronic system to which a semiconductor package according to an exemplary embodiment is applied.

FIG. 12 is a block diagram of an electronic system to which a semiconductor package according to one embodiment is applied.

Referring to FIG. 12, an electronic system 900 may include at least one of the semiconductor packages according to the above-described embodiments. The electronic system 900 may include mobile devices, computers, and the like. The electronic system 900 may include, for example, a memory system 912, a processor 914, a random access memory (RAM) 916, and a user interface 918, which may perform data communications via a bus 920. The processor 914 executes a program and controls the electronic system 900. The RAM 916 may be used as an operating memory of the processor 914. The processor 914, the memory 912, and/or the RAM 916 may include a semiconductor package according to the embodiments described above. In one embodiment, the processor 914 and the RAM 916 may be incorporated into a single package that employs one of the embodiments described above. The user interface 918 may be used to input/output data to/from the electronic system 900. The memory system 912 may store codes for operating the processor 914, data processed by the processor 914, or externally input data. The memory system 912 may include a controller and a memory, and may be configured, for example, in the same manner as the memory card 800 shown in FIG. 11.

Figure 13:
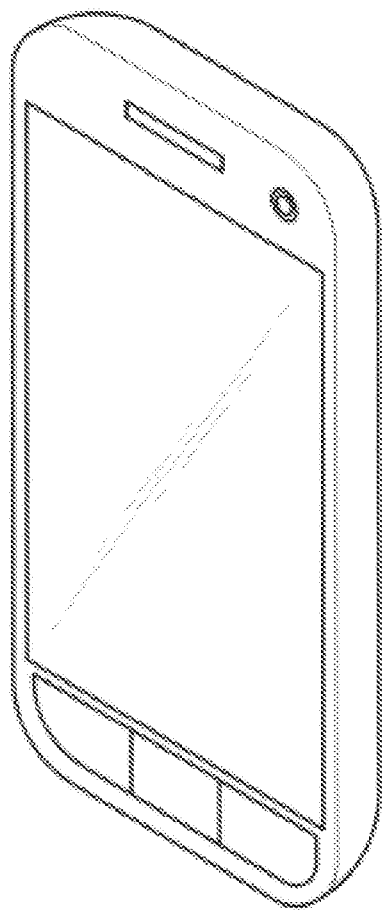
FIG. 13 illustrates an example of application of the electronic system shown in FIG. 12.

The electronic system 900 may be employed to electronic control devices for various electronic devices. FIG. 13 illustrates an example of application of the electronic system shown in FIG. 12. For example, FIG. 13 illustrates that an electronic system (900 of FIG. 12) is applied to a mobile phone 1000. In addition, the electronic system (900 of FIG. 12) may also be applied to other devices, such as a portable notebook computer, an MP3 player, a navigation system, a solid state disk (SSD), automobiles, household appliances, and so on.

Figure 14:
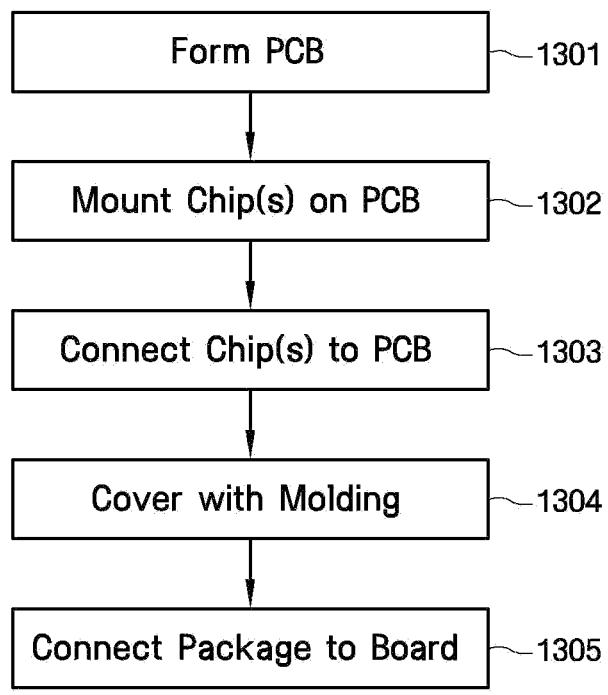
FIG. 14 is a flowchart showing an exemplary method of manufacturing a semiconductor package, according to one embodiment.

FIG. 14 is a flowchart showing an exemplary method 1300 of manufacturing a semiconductor product including a package connected to a board, according to one embodiment. The product may be, for example, a memory module, or a component in a device such as a smart phone, PDA, laptop computer, etc. In step 1301, a PCB is formed. For example, a PCB such as described above may be formed to include a core having two or more core layers having different CTEs, an upper wiring layer including an insulating layer and conductive wiring, and a lower wiring layer including an insulating layer and conductive wiring. In step 1302, one or more semiconductor chips are mounted on the PCB. For example, the chips may be memory chips, logic chips, or a combination thereof. In step 1303, the chips are connected to the PCB using, for example, a heating process, such as a reflow process that connects the PCB to the chips using, for example, solder bumps or balls. Alternatively, to connect the chips to the PCB, an adhesive and wire bonding, including a wired bonding heating process, may be used. In step 1304, the combined PCB and chips are covered with a molding, such as an epoxy resin, that protects the exposed portions of the chips and the PCB. As such, a package such as shown in FIGS. 4-8 is formed. Then, in step 1305, the package is connected to a board, such as a system board or module board, using, for example, another heating process for solder bumps or balls that connects the package to the board. In the embodiments described above, because a PCB core that includes two materials having different CTEs is used, warpage of the package during the method 1300 is minimized.

While the present disclosure has been particularly shown and described with reference to exemplary embodiments thereof, it will be understood by those of ordinary skill in the art that various changes in form and details may be made therein without departing from the spirit and scope of the present invention as defined by the following claims. It is therefore desired that the present embodiments be considered in all respects as illustrative and not restrictive, reference being made to the appended claims rather than the foregoing description to indicate the scope of the invention.

What is claimed is:

1. A semiconductor package comprising:
a printed circuit board (PCB);
a semiconductor chip mounted on the PCB; and
a molding portion covering the semiconductor chip,
wherein the PCB comprises:
a core layer having a stacked structure including at least a first sub-core layer made of a first material having a first coefficient of thermal expansion (CTE) and a second sub-core layer made of a second material having a second CTE greater than the first CTE, wherein the first sub-core layer includes a first homogenous material, and the second sub-core layer includes a second homogenous material, wherein the first homogenous material is different from second homogenous material:
an upper wiring layer disposed between the core layer and the semiconductor chip, and
a lower wiring layer disposed on the core layer, opposite to the upper wiring layer.

2. The semiconductor package of claim 1, wherein the first sub-core layer is disposed between the second sub-core layer and the molding portion.

3. A semiconductor package comprising:
a printed circuit board (PCB);
a semiconductor chip mounted on the PCB; and
a molding portion having a coefficient of thermal expansion (CTE) and covering the semiconductor chip,
wherein the PCB comprises:
a core layer having a stacked structure including at least a first layer made of a first material and a second layer made of a second material different from the first material, wherein the second layer is disposed between the layer and the molding portion;
an upper wiring layer disposed between the core layer and the semiconductor chip; and
a lower wiring layer disposed on the core layer opposite to the upper wiring layer,
wherein the first layer and second layer have different coefficients of thermal expansion CTEs, and
wherein the CTE of the first layer has a value between the CTE of the molding portion and the CTE of the second layer.

4. The semiconductor package of claim 3, wherein the CTE of the second layer is greater than the CTE of the first layer.

5. The semiconductor package of claim 4, wherein the second layer includes copper, and the first layer includes an alloy.

6. The semiconductor package of claim 4, wherein the second layer includes copper or an alloy, and the first layer includes glass fiber.

7. The semiconductor package of claim 3, wherein the CTE of the first layer is greater than the CTE of the second layer.

8. The semiconductor package of claim 7, wherein the first layer includes copper, and the second layer includes an alloy.

9. The semiconductor package of claim 7, wherein the first layer includes copper or an alloy, and the second layer includes glass fiber.

10. The semiconductor package of claim 3, wherein the first layer is directly adjacent to the second layer.

11. The semiconductor package of claim 3, wherein the upper wiring layer and the lower wiring layer are formed of insulating materials having the same CTE.

12. The semiconductor package of claim 3, wherein based on the CTEs of the first layer, the second layer, and the molding portion, a bending force due to CTE differences between the first layer and second layer offsets a bending force due to CTE differences between the PCB and the molding portion.

13. A semiconductor package comprising:
a printed circuit board (PCB);
a semiconductor chip mounted on the PCB; and
a molding portion covering the semiconductor chip,
wherein the PCB comprises:
a core layer having a vertically stacked structure including a upper layer made of a first material that has a first coefficient of thermal expansion (CTE) and a lower layer made of a second material that has a second CTE different from the first CTE;
an upper wiring layer disposed on a first surface of the upper layer that comprises a top surface of the core layer, wherein a bottom surface of the upper wiring layer is adjacent the top surface of the core layer, and the upper wiring layer extends away from the top surface of the core layer, and wherein the upper wiring layer includes an upper circuit pattern and an upper insulation layer comprising an insulating material; and
a lower wiring layer disposed on a first surface of the lower layer that comprises a bottom surface of the core layer opposite the top surface of the core layer, wherein a top surface of the lower wiring layer is adjacent the bottom surface of the core layer, and the lower wiring layer extends away from the bottom surface of the core layer, wherein the lower wiring layer includes a circuit pattern and a lower insulation layer comprising an insulating material,
wherein each of the upper layer and the lower layer extend from a first end of the substrate to a second end of the substrate,
wherein the molding portion has a third coefficient of thermal expansion (CTE), and
wherein the second CTE of the lower layer has a value between the third CTE of the molding portion and the first CTE of the upper layer.

14. The semiconductor package of claim 13, wherein the second CTE of the lower layer is lower than the first CTE of the upper layer, and is greater than the third CTE of the molding portion.

15. The semiconductor package of claim 13, wherein the upper layer includes a conductive material and the lower layer includes an insulating material.

16. The semiconductor package of claim 15, wherein the conductive material includes an alloy or copper and the insulating material includes glass fiber.

17. The semiconductor package of claim 13, wherein the lower layer includes an alloy and the upper layer includes copper.

18. The semiconductor package of claim 13, wherein the first sub-core layer includes a first homogenous material that extends from the first end of the substrate to the second end of the substrate, and the second sub-core layer includes a second homogenous material that extends from the first end of the substrate to the second end of the substrate, wherein the first homogenous material is different from the second homogenous material.

19. The semiconductor package of claim 13, wherein the upper wiring layer and the lower wiring layer include the same insulating material.

* * * * *